(12) United States Patent
Charlebois et al.

(10) Patent No.: US 7,194,715 B2
(45) Date of Patent: Mar. 20, 2007

(54) METHOD AND SYSTEM FOR PERFORMING STATIC TIMING ANALYSIS ON DIGITAL ELECTRONIC CIRCUITS

(75) Inventors: Steven E. Charlebois, Jericho, VT (US); Gerard M. Salem, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 418 days.

(21) Appl. No.: 10/709,376

(22) Filed: Apr. 30, 2004

(65) Prior Publication Data

US 2005/0246673 A1     Nov. 3, 2005

(51) Int. Cl.
   *G06F 17/50*     (2006.01)
(52) U.S. Cl. .................... 716/6; 716/4; 716/5
(58) Field of Classification Search ............... 716/4–6
    See application file for complete search history.

(56) References Cited

U.S. PATENT DOCUMENTS

| | | | |
|---|---|---|---|
| 6,099,580 A * | 8/2000 | Boyle et al. ............... | 716/7 |
| 6,237,127 B1 | 5/2001 | Craven et al. | |
| 6,308,299 B1 | 10/2001 | Burch et al. | |
| 6,530,073 B2 * | 3/2003 | Morgan ..................... | 716/18 |
| 6,539,536 B1 * | 3/2003 | Singh et al. ................ | 716/18 |
| 6,557,145 B2 * | 4/2003 | Boyle et al. ................ | 716/2 |
| 6,564,358 B2 * | 5/2003 | Moondanos et al. ......... | 716/5 |
| 6,668,362 B1 * | 12/2003 | McIlwain et al. ............ | 716/5 |
| 6,792,581 B2 * | 9/2004 | Moondanos et al. ......... | 716/4 |
| 6,810,505 B2 * | 10/2004 | Tetelbaum et al. .......... | 716/1 |

* cited by examiner

*Primary Examiner*—Vuthe Siek
(74) *Attorney, Agent, or Firm*—Michael J. Le Strange; Dillon & Yudell LLP

(57) ABSTRACT

A method for performing static timing analysis on digital electronic circuits is disclosed. A snip (or DC adjust) file is initially generated. Static timing analysis is then performed on the final circuit netlist using the snip file. If the final circuit netlist meets all the timing constraints, the snip file is converted to a group of cutpoints, and formal verification is performed on the cutpoints. A determination is made as to whether or not the cutpoints pass formal verification. If the cutpoints pass formal verification, the user analysis on the final circuit netlist is completed, and the final circuit netlist can proceed to manufacturing. Otherwise, if the cutpoints do not pass formal verification, a flag is issued to alert a user. The user then has to either modify certain snip point(s) within the snip file or modify the circuit netlist, and perform the user analysis again.

12 Claims, 4 Drawing Sheets

METHOD AND SYSTEM FOR PERFORMING STATIC TIMING ANALYSIS ON DIGITAL ELECTRONIC CIRCUITS

BACKGROUND OF INVENTION

1. Technical Field

The present invention relates to software tools in general, and, in particular, to software tools for verifying integrated circuit designs. Still more particularly, the present invention relates to a method and system for performing static timing analysis on digital electronic circuits.

2. Description of Related Art

In the field of integrated circuit (IC) design, digital electronic circuits are initially represented by a high-level abstraction written in hardware description language (HDL).

The HDL representation allows a circuit designer to express all the desired functionality of a digital electronic circuit at the register transfer level (RTL) of abstraction.

The HDL representation is then converted into a circuit file through a process known as synthesis that involves translation and optimization. Finally, static timing analysis and formal verification are performed on the circuit file. Static timing analysis verifies that the circuit design performs at target clock speeds. Formal verification ensures that the circuit file is functionally correct compared to the HDL.

In order to simplify static timing analysis, circuit designers commonly identify and eliminate a selected set of non-critical timing paths throughout a circuit design when performing static timing analysis on the circuit design. Such set of non-critical timing paths is usually called a snip (or exception) file. For most circuit designs, such practice is usually done to eliminate false timing violations during static timing analysis. However, when the critical timing paths of some circuit designs are masked as part of the cone of logic of the eliminated non-critical timing paths, the elimination of the non-critical timing paths could lead to a real timing violation to go undetected during static timing analysis. The real timing violation may not even be realized until actual hardware is manufactured. Consequently, it would be desirable to provide an improved method for performing static timing analysis on digital electronic circuits.

SUMMARY OF INVENTION

In accordance with a preferred embodiment of the present invention, a user analysis is performed on a final circuit netlist. The user analysis includes static timing analysis and formal verification. A snip (or DC adjust) file is initially generated. The snip file includes a selected set of non-critical timing signals and paths of the final circuit netlist that have been elected to be not checked during static timing analysis. Static timing analysis is then performed on the final circuit netlist using the snip file. If the final circuit netlist meets all the timing constraints, the snip file is converted to a group of cutpoints, and formal verification is performed on the cutpoints. A determination is then made as to whether or not the cutpoints pass formal verification. If the cutpoints pass formal verification, the user analysis on the final circuit netlist is completed, and the final circuit netlist can proceed to manufacturing. Otherwise, if the cutpoints do not pass formal verification, a flag is issued to alert a user. The user then has to either modify certain snip points within the snip file or modify the circuit netlist, and perform the user analysis again.

All features and advantages of the present invention will become apparent in the following detailed written description.

BRIEF DESCRIPTION OF DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
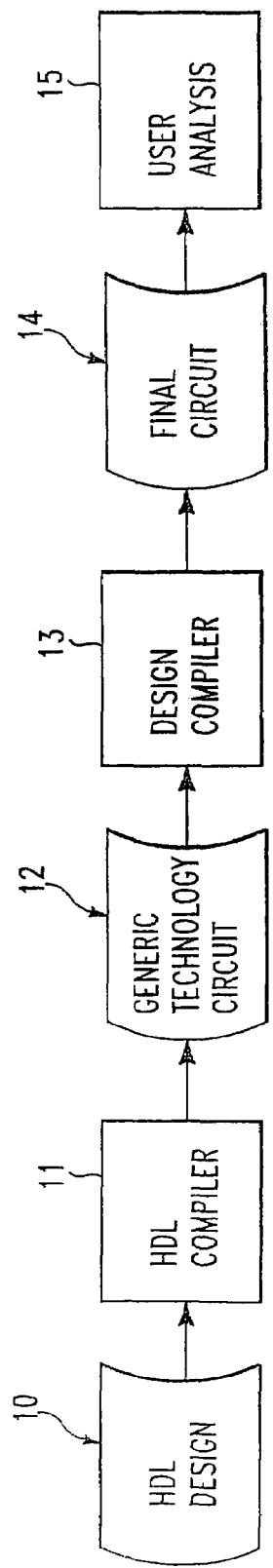
FIG. 1 is a high-level logic flow diagram of a design environment, in accordance with a preferred embodiment of the present invention.

Referring now to the drawings and in particular to FIG. 1, there is illustrated a high-level logic flow diagram of a design environment, in accordance with a preferred embodiment of the present invention. As shown, a hardware description language (HDL) compiler 11 translates a high-level description of a digital circuit design, such as a HDL design 10, into a generic technology circuit netlist 12. A design compiler 13 then translates generic technology circuit netlist 12 into a final circuit netlist 14. Final circuit netlist 14 is an optimized implementation of HDL design 10 in accordance with a specific processing technology. Final circuit netlist 14 is subsequently subjected to an user analysis 15 by a circuit designer in order to explore various aspects of the final circuit's performance that may not have been completely addressed by design compiler 13.

At the level of HDL design 10, the circuit design is described in a high-level language such as Verilog HDL. The design hierarchy of HDL design 10 is expressed in terms of blocks connected together by ports. At the level of generic technology circuit netlist 12, the circuit design is specified in terms of a netlist. In general, a netlist is a connection-oriented description of the circuit design. Specifically, a netlist is a collection of device objects that have connection points called pins. The pins of the device objects are connected together by wire objects to form electrical nodes. The device objects are typically of two types: those that represent flip flops and those that represent combinational logic. Design compiler 13 provides an interface by which the designer can ascertain the names of various pins in generic technology circuit netlist 12. Clock waveforms can then be applied to the desired pins.

User analysis 15 includes static timing analysis and formal verification. When formal verification is run, the cones of logic that are usually being checked for Boolean comparison are one of the following types:

i. latch back to primary inputs or other latches; and ii. primary output back to primary inputs or other latches.

Static timing analysis verifies that the circuit design performs at target clock speeds, and formal verification ensures that the circuit design is functionally correct by comparing final circuit netlist 14 with HDL design 10. Exceptions can be used during user analysis 15. Generally speaking, there are two types of exceptions. The first type of exceptions allows a circuit designer to specify that certain timing paths have greater than default timing constraints and thereby cause other normally non-critical timing paths in final circuit netlist 14 to be analyzed as critical timing paths. The second type of exceptions informs the static timing analysis tool in user analysis 15 not to time (or calculate) certain paths in final circuit netlist 14.

Exceptions can be specified in terms of paths through certain pins of the selected technology-specific cells (or instances), but exceptions can also be specified in terms of technology-specific cells. The use of exceptions during static timing analysis allows a circuit designer to investigate how critical timing paths meet the circuit's timing constraints. Some examples of signals and timing paths that are typically not timed during static timing analysis include:

i. mode bits that are set at reset time and would not be changed in functional mode;

ii. test signals that are not used during functional mode;

iii. debug signals that have no timing requirement or a different timing requirement than the functional mode logic; and iv. unused function for a particular implementation.

However, when critical signals and timing paths of a circuit design is masked as part of the cone of logic of non-critical signals and timing paths (in the snip file), the elimination of a selected set of non-critical signals and timing paths from the circuit design could lead to a timing violation being undetected during static timing analysis. Such a problem is illustrated by FIGS. 2 and 3.

Figure 2:
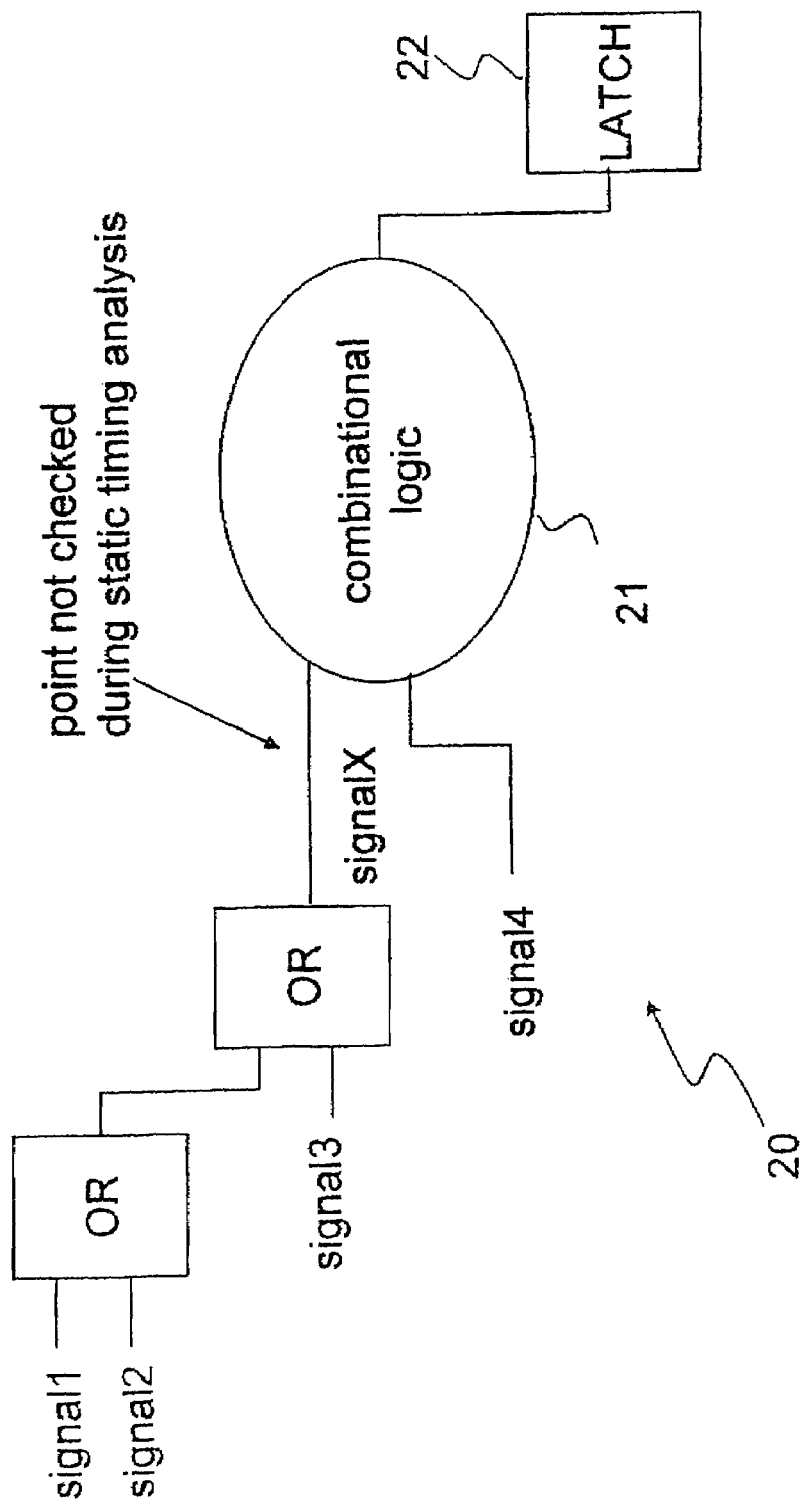
FIGS. 2 and 3 are circuit diagrams illustrating problems associated with the prior art method of performing static timing analysis on digital electronic circuits.
Figure 3:
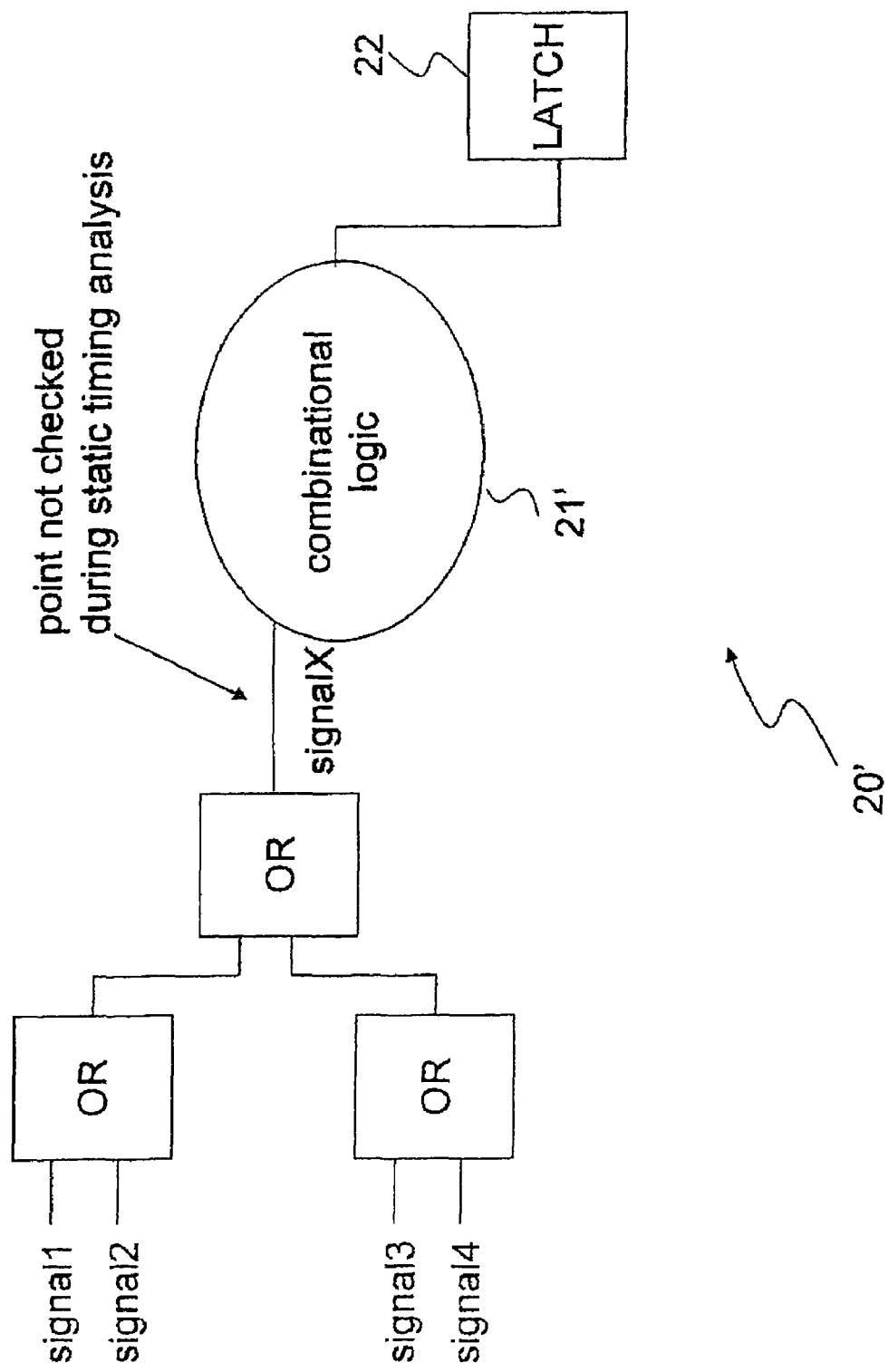

In FIG. 2, the functionality of signalX in a circuit 20 can be defined in HDL as follows:

signalX:=(signal1 or signal2) or signal3;

For the present example, signalX is assumed to be one of the signals in circuit 20 that will not be timed under static timing analysis, for whatever reasons. The logic for signalX continues forward into a combinatorial logic block 21 and eventually goes into an input of a latch 22. Since signalX is not going to be checked by static timing analysis, a circuit designer will make signalX into a snip point. After static timing analysis has been successfully completed, formal verification would normally be used to ensure that the functionality of latch 22 is identical between an HDL design of circuit 20 and a final circuit netlist of circuit 20. Hence, formal verification is typically performed after static timing analysis to compare the final circuit netlist for the specific cone of logic in FIG. 2 where the endpoint is latch 22.

The problem lies upon the fact that the actual implementation of circuit 20 as described by the final circuit netlist may not be the same as the conceptual description of circuit 20 in HDL. For example, after the synthesis of the circuit file of circuit 20, the final circuit netlist of circuit 20 may be implemented with the logic illustrated by circuit 20' as shown in FIG. 3. Other than synthesis, the logic of circuit 20 can also be restructured by a manual change due to various engineering reasons. Even though the overall functionalities of circuit 20 in FIG. 2 are the same as those of circuit 20' in FIG. 3, signalX in FIG. 3 has a different specific function than signalX in FIG. 2, as follows:

signalX:=(signal1 or signal2) or (signal3 or signal4);

If formal verification was not performed on signalX by specifying signalX as a cut point, a circuit designer would not have known that signal4 is now part of the signalX logic cone as illustrated in FIG. 3. If signal4 is a timing critical signal, it would not have been determined whether a timing problem existed in the design relating to signal4 since it was specified that signalX be snipped in the snip file and the signal path for signal4 would not be checked for timing violations. In other words, signal4 would have been masked or hidden from static timing analysis because of the snipping of signalX.

However, had a functional equivalence comparison with the HDL design been performed using formal verification on signalX in FIG. 3, the functional equivalence comparison would have failed. The situation where a potential timing violation might exist in the final circuit netlist would have been exposed because the final circuit netlist contains a timing snip point, signalX, that is not functionally equivalent to the HDL design. A circuit designer would have then realized the potential timing violation. At such point, the circuit designer can change either the snip point or the final circuit netlist so that the snip point becomes functionally equivalent to the HDL design for signalX.

In accordance with a preferred embodiment of the present invention, formal verification is used to check the functionality for any snip point in a circuit design. In other words, if a particular signal (or wire object) has been elected to not being timed, such as snip points or don't care adjust, during static timing analysis, then such signal should be verified with formal verification by designating such signal as a cutpoint. Such verification ensures that an HDL design and a final circuit netlist have identical functionality for the same signal. The verification of the functionality of signals that have been elected to not be checked during static timing analysis can prevent the possibility of a final circuit netlist containing timing critical signals as part of the non-timed logic cone. As a result, timing critical signals are prevented from not being checked for timing violations.

Figure 4:
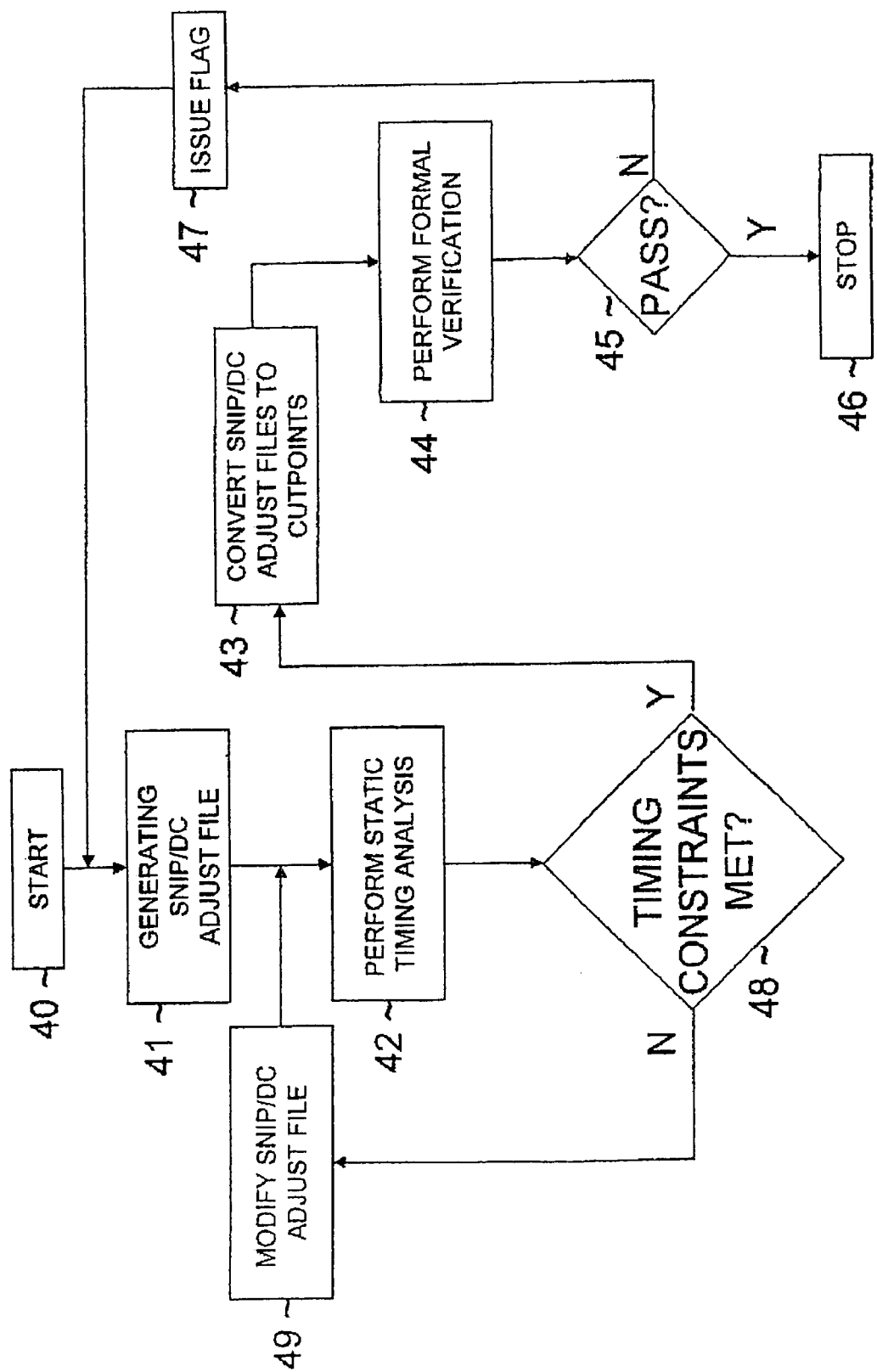
FIG. 4 is a high-level logic flow diagram of a method for performing static timing analysis on digital electronic circuits, in accordance with a preferred embodiment of the present invention.

With reference now to FIG. 4, there is depicted a high-level logic flow diagram of a method for performing static timing analysis on digital electronic circuits, in accordance with a preferred embodiment of the present invention. Starting at block 40, a snip (or DC adjust) file is generated, as shown in block 41. The snip file includes a selected set of the non-critical timing signals and paths that have been elected to be not checked during static timing analysis. Static timing analysis is then performed on a final circuit netlist using the snip file, as depicted in block 42. A determination is then made as to whether or not the final circuit netlist meets all the timing constraints, as depicted in block 48. If the final circuit netlist does not meet all the timing constraints, the snip file is modified, as shown in block 49, and static timing analysis is performed on a final circuit netlist using the modified snip file, as depicted in block 42.

Otherwise, if the final circuit netlist meets all the timing constraints, the snip file is converted to specific cutpoints accordingly, as shown in block 43. Next, formal verification is performed on the cutpoints, as depicted in block 44. During formal verification, the functionality of the cutpoints are compared to the corresponding circuit nodes in the HDL design. A determination is made as to whether or not the cutpoints pass formal verification, as shown in block 45. If the cutpoints do not pass formal verification, a flag is sent to inform a circuit designer regarding the functionality of cutpoints not matching between the final circuit netlist and the corresponding circuit nodes in the HDL design, as shown in block 47. At such point, the circuit designer can modify either the snip file or the final circuit netlist and submits the final circuit netlist through static timing analysis again at block 41. Otherwise, if the cutpoints pass formal verification, the process is completed, as depicted in block 46.

Figure 5:
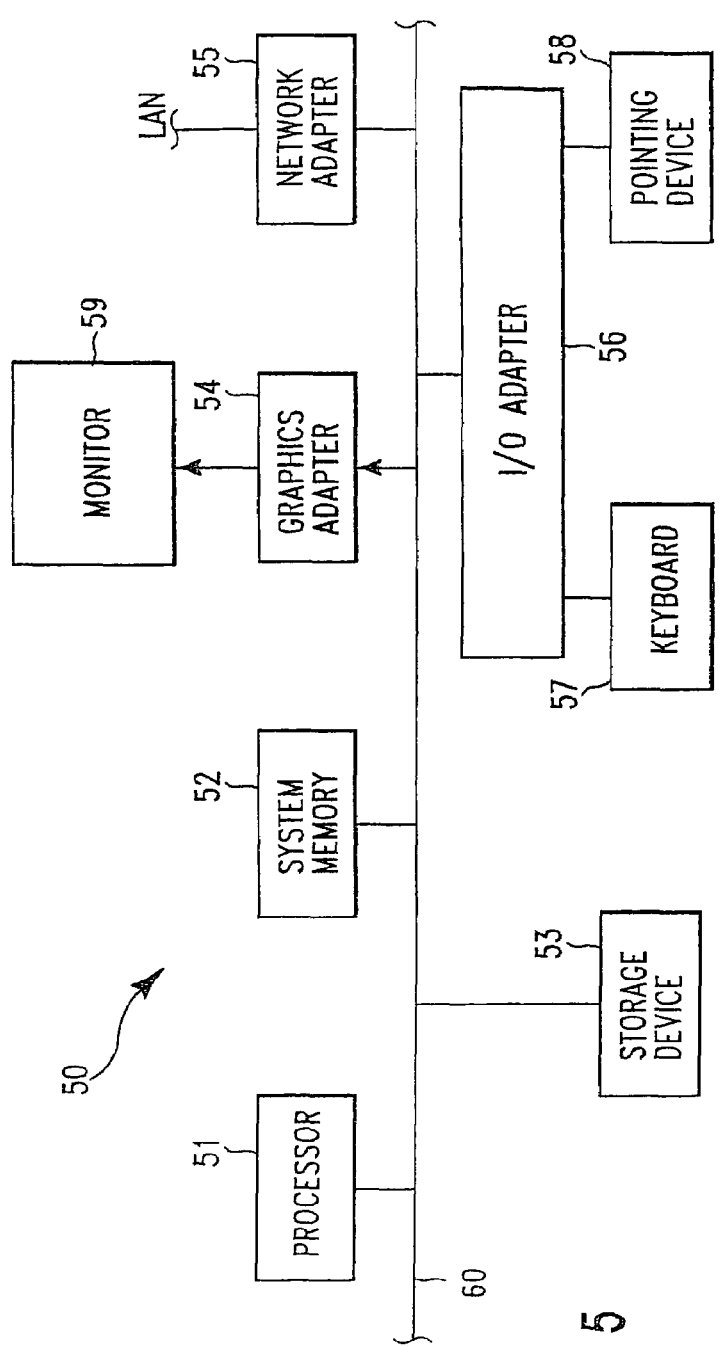
FIG. 5 is a block diagram of a data processing system for performing circuit verification, in accordance with a preferred embodiment of the present invention.

Referring now to FIG. 5, there is depicted a block diagram of a data processing system for performing circuit verification, in accordance with a preferred embodiment of the present invention. As shown, a data processing system 50 includes a processor 51, a system memory 52, a storage device 53, a graphics adapter 54 and a network adapter 55, all coupled to a bus 60. Also coupled to bus 60 is an input/output adapter 56 to which a keyboard 57 and a pointing device 58 are attached. Storage device 53 can be a hard drive or any other type of storage device capable of storing a large amount of data. Pointing device 58 can be a mouse, a track ball, etc. Graphics adapter 54 generates text and graphical information to be displayed by a monitor 59. Network adapter 55 couples data processing system 50 to a local-area network or wide-area network (not shown).

As has been described, the present invention provides an improved method and system for performing static timing analysis on digital electronic circuits. The method of the present invention ensures that critical timing paths are not masked as part of the cones of logic of a selected set of non-critical timing paths (snip points). The cones of logic are compared in both the HDL design and final circuit netlist using formal verification to insure they are equivalent, thus preventing a critical timing signal from being masked in any of the cones of logic. Ultimately, the present invention prevents the creation of hardware that could have a hidden timing violation related to any signals that are intentionally left unchecked by static timing analysis.

Although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

The invention claimed is:

1. A method for performing static timing analysis on an integrated circuit design, said method comprising:
   performing static timing analysis on a final circuit netlist file utilizing a snip file, wherein said snip files includes signals and/or timing paths that are not subject to said static timing analysis;
   converting said snip file to a plurality of cutpoints after said final circuit netlist file met all timing constraints under said static timing analysis;
   performing formal verification on said plurality of cutpoints;
   determining whether or not said plurality of cutpoints pass said formal verification;
   in response to a determination that said plurality of cutpoints do not pass said formal verification, issuing a flag to alert a user; and
   in response to a determination that said plurality of cutpoints pass said formal verification, sending said final circuit netlist file to manufacturing.

2. The method of claim 1, wherein said method further includes, in response to a determination that said plurality of cutpoints do not pass said formal verification, modifying said final circuit netlist file and returning to said performing static timing analysis with said modified final circuit netlist file.

3. The method of claim 1, wherein said method further includes, in response to a determination that said plurality of cutpoints do not pass said formal verification, modifying said snip file and returning to said converting said snip file with said modified snip file.

4. The method of claim 1, wherein said performing formal verification further includes performing a functional equivalence comparison between said plurality of cutpoints and corresponding HDL design of said plurality of cutpoints.

5. A computer usable medium having a computer program product for performing static timing analysis on an integrated circuit design, said computer usable medium comprising:
   program code means for performing static timing analysis on a final circuit netlist file utilizing a snip file, wherein said snip files includes signals and/or timing paths that are not subject to said static timing analysis;
   program code means for converting said snip file to a plurality of cutpoints after said final circuit netlist file met all timing constraints under said static timing analysis;
   program code means for performing formal verification on said plurality of cutpoints;
   program code means for determining whether or not said plurality of cutpoints pass said formal verification;
   program code means for issuing a flag to alert a user, in response to a determination that said plurality of cutpoints do not pass said formal verification; and
   program code means for sending said final circuit netlist file to manufacturing, in response to a determination that said plurality of cutpoints pass said formal verification.

6. The computer usable medium of claim 5, wherein said computer program product further includes, in response to a determination that said plurality of cutpoints do not pass said formal verification, program code means for modifying said final circuit netlist file and returning to said performing static timing analysis with said modified final circuit netlist file.

7. The computer usable medium of claim 5, wherein said computer program product further includes, in response to a determination that said plurality of cutpoints do not pass said formal verification, program code means for modifying said snip file and returning to said converting said snip file with said modified snip file.

8. The computer usable medium of claim 5, wherein said computer program product for performing formal verification further includes program code means for performing a functional equivalence comparison between said plurality of cutpoints and corresponding HDL design of said plurality of cutpoints.

9. A computer system for performing static timing analysis on an integrated circuit design, said computer system comprising:
   means for performing static timing analysis on a final circuit netlist file utilizing a snip file, wherein said snip files includes signals and/or timing paths that are not subject to said static timing analysis;
   means for converting said snip file to a plurality of cutpoints after said final circuit netlist file met all timing constraints under said static timing analysis;
   means for performing formal verification on said plurality of cutpoints;
   means for determining whether or not said plurality of cutpoints pass said formal verification;

means for issuing a flag to alert a user, in response to a determination that said plurality of cutpoints do not pass said formal verification; and means for sending said final circuit netlist file to manufacturing, in response to a determination that said plurality of cutpoints pass said formal verification.

10. The computer system of claim 9, wherein said computer system further includes, in response to a determination that said plurality of cutpoints do not pass said formal verification, means for modifying said final netlist file and returning to said performing static timing analysis with said modified final circuit netlist file.

11. The computer system of claim 9, wherein said computer system further includes, in response to a determination that said plurality of cutpoints do not pass said formal verification, means for modifying said snip file and returning to said converting said snip file with said modified snip file.

12. The computer system of claim 9, wherein said computer system for performing formal verification further includes means for performing a functional equivalence comparison between said plurality of cutpoints and corresponding HDL design of said plurality of cutpoints.

* * * * *